United States Patent
Meng et al.

(10) Patent No.: US 11,540,056 B2
(45) Date of Patent: Dec. 27, 2022

(54) SPEAKER AND MAGNETIC CIRCUIT SYSTEM THEREOF

(71) Applicant: Changzhou AMT Co., Ltd, Jiangsu (CN)

(72) Inventors: Xianzhen Meng, Jiangsu (CN); Cheng Zhai, Jiangsu (CN); Dengwei Wang, Jiangsu (CN); Chuankun Ding, Jiangsu (CN)

(73) Assignee: Changzhou AMT Co., Ltd, Changzhou (CN)

( * ) Notice: Subject to any disclaimer, the term of this patent is extended or adjusted under 35 U.S.C. 154(b) by 72 days.

(21) Appl. No.: 17/277,931

(22) PCT Filed: Sep. 20, 2019

(86) PCT No.: PCT/CN2019/107098
§ 371 (c)(1),
(2) Date: Mar. 19, 2021

(87) PCT Pub. No.: WO2020/057655
PCT Pub. Date: Mar. 26, 2020

(65) Prior Publication Data
US 2021/0360350 A1    Nov. 18, 2021

(30) Foreign Application Priority Data

Sep. 20, 2018  (CN) .......................... 201811100849.0
Aug. 26, 2019  (CN) .......................... 201921396383.3

(51) Int. Cl.
*H04R 9/02* (2006.01)
*H04R 7/04* (2006.01)
*H05K 1/02* (2006.01)

(52) U.S. Cl.
CPC .............. *H04R 9/025* (2013.01); *H04R 7/04* (2013.01); *H05K 1/0277* (2013.01); *H05K 2201/10083* (2013.01)

(58) Field of Classification Search
CPC .......... H04R 9/025; H04R 7/04; H04R 9/046; H04R 9/047; H04R 9/06; H04R 9/063; (Continued)

(56) References Cited

U.S. PATENT DOCUMENTS 3,873,784 A    3/1975  Doschek
2003/0068063 A1    4/2003  Usuki et al.
(Continued)

FOREIGN PATENT DOCUMENTS

CN    206136279 U    4/2017
CN    208971799 U    6/2019
(Continued)

OTHER PUBLICATIONS

Extended European Search Report of counterpart European Patent Application No. 19863064.2 dated Oct. 28, 2021.
(Continued)

*Primary Examiner* — Brian Ensey

(57) ABSTRACT

The present disclosure relates to a speaker and a magnetic circuit system thereof. The speaker includes a housing and at least one magnetic circuit system and at least one vibration system arranged in the housing. The at least one vibration system includes at least one layer of drive circuit configured to generate mechanical motion under the action of a magnetic field of the at least one magnetic circuit system, and a diaphragm driven by the at least one layer of drive circuit. The at least one layer of driving circuit is mounted to the diaphragm and has a planar shape. Since the
(Continued)

driving circuit of the vibration system has a planar shape, the thickness of the speaker of the present disclosure can be effectively reduced.

17 Claims, 10 Drawing Sheets

(58) Field of Classification Search
CPC ........ H04R 13/00; H04R 7/02; H05K 1/0277; H05K 2201/10083
See application file for complete search history.

(56) References Cited

U.S. PATENT DOCUMENTS

| | | | |
|---|---|---|---|
| 2007/0223735 A1* | 9/2007 | LoPresti | H04R 1/24 381/99 |
| 2008/0044044 A1 | 2/2008 | Madaffari et al. | |
| 2015/0003662 A1 | 1/2015 | Vernon et al. | |
| 2016/0212546 A1* | 7/2016 | Salvatti | H04R 9/06 |
| 2018/0084346 A1* | 3/2018 | Yang | H04R 7/18 |

FOREIGN PATENT DOCUMENTS

| | | | | |
|---|---|---|---|---|
| JP | 2006101368 A | 4/2006 | | |
| JP | 2009049757 A | 3/2009 | | |
| KR | 1020020003573 A | 1/2002 | | |
| KR | 101148833 B1 | 5/2012 | | |
| WO | WO-2005115053 A1 * | 12/2005 | ............. | H04R 9/025 |
| WO | WO-2018050032 A1 * | 3/2018 | ............... | H04R 9/02 |

OTHER PUBLICATIONS

Examination report of Counterpart Indian Patent Application No. 202137012170 dated Feb. 3, 2022.
Office Action of Counterpart Japanese Patent Application No. 2021-516577 dated Jul. 12, 2022.
Office Action of Counterpart Korean Patent Application No. 10-2021-7008522 dated Jul. 25, 2022.
M.C. Killion et al., 3.2.2. Receivers In:"Hearing Aids", Springer Internaltional Publishing AG, Oct. 5, 2016, XP055847248, pp. 64-65.
International search report of PCT Patent Application No. PCT/CN2019/107098 dated Dec. 18, 2019.

* cited by examiner

30

SPEAKER AND MAGNETIC CIRCUIT SYSTEM THEREOF

FIELD

The present invention relates to an acoustic technology, and more particularly, to a speaker and a magnetic circuit system thereof.

BACKGROUND

A speaker is an electro-acoustic element configured to convert electrical signals into acoustic signals. With current trend of thinning, size requirements for the speaker are more stringent.

The speaker in the related art includes a balance armature unit and a dynamic speaker unit. The balance armature unit drives a diaphragm to vibrate through a drive rod and to therefore generate sound. The speaker of this structure has a regular appearance and small volume, but the structure is complicated, and its cost is high. The dynamic speaker unit has a relatively simple structure, and its cost is low, but its shape is irregular, and its size is too large.

SUMMARY

Technical problem to be solved by the present disclosure is to provide an improved speaker and a magnetic circuit system thereof.

In order to solve the above-mentioned technical problems, the present disclosure provides a speaker, including a housing and at least one magnetic circuit system and at least one vibration system arranged in the housing; wherein the at least one vibration system includes at least one layer of drive circuit configured to generate mechanical motion by the action of magnetic field of the at least one magnetic circuit system, and a diaphragm driven by the at least one layer of driving circuit; the at least one layer of driving circuit is sticked to the diaphragm and has a planar shape.

In some embodiments, the at least one layer of driving circuit includes at least one layer of coil unit; and the at least one layer of coil unit is formed by winding conductor wires and is planar-shaped.

In some embodiments, the at least one magnetic circuit system includes a plurality of magnets arranged in an array directly below the at least one layer of coil unit; and two magnetic poles of each of the magnet are located on an upper side and a lower side thereof, and polarities of adjacent magnets are opposite to each other.

In some embodiments, the plurality of magnets includes three magnets arranged spaced apart; a first gap is defined between a first magnet and a second magnet of the three magnets; a second gap is defined between the second magnet and a third magnet of the three magnets; the at least one layer of coil unit includes two straight portions with opposite current directions during an operation; and the two straight portions are respectively arranged corresponding to the first gap and the second gap.

In some embodiments, the at least one layer of coil unit is formed by spirally winding conductor wires in a plane.

In some embodiments, the at least one layer of coil unit is in a shape of a racetrack; and the three magnets are all in a shape of a strip and are arranged in parallel and spaced apart.

In some embodiments, at least parts of the plurality of magnets include permanent magnets or electromagnets.

In some embodiments, the at least one layer of coil unit includes at least two layers of coil unit; the at least two layers of coil unit are coupled in series and stacked; and current directions of the at least two layers of coil unit are the same during an operation.

In some embodiments, the at least one vibration system includes a ring; the diaphragm includes a film and a paddle; the ring is horizontally arranged directly above the magnetic circuit system; a peripheral edge of the film is coupled to the ring; a back surface of the paddle is coupled to a front surface of a middle part of the film; the paddle is moveable up and down relative to the ring; and a back surface of the at least one layer of coil unit is coupled to a front surface of the paddle.

In some embodiments, the at least one magnetic circuit system includes two magnetic circuit systems; the two magnetic circuit systems are arranged up and down; and the at least one vibration system is arranged between the two magnetic circuit systems.

In some embodiments, the at least one vibration system includes two vibration system; the two vibration systems are arranged up and down and spaced apart, and respectively correspond to the two magnetic circuit systems.

In some embodiments, the diaphragm includes a circuit board; and the at least one layer of driving circuit is printed on the circuit board.

In some embodiments, the circuit board includes a flexible circuit board.

In some embodiments, the magnetic circuit system includes a plurality of first magnets arranged in parallel and spaced apart; and the first permanent magnets are polarized in a up and down direction and polarization directions of every two adjacent first permanent magnets are opposite to each other.

In some embodiments, the at least one layer of driving circuit includes a plurality of straight portions; and the straight portions are correspondingly arranged directly above driving space between each of two adjacent first magnets.

In some embodiments, the magnetic circuit system includes a plurality of second magnets arranged alternately with the plurality of first magnets; the first permanent magnets are polarized in a up and down direction and polarization directions of every two adjacent first permanent magnets are opposite to each other, the second permanent magnets are polarized in a left and right direction and polarization directions of every two adjacent second permanent magnets are opposite to each other.

A magnetic circuit system for a speaker is provided. The magnetic circuit system includes a magnet array. The magnet array includes a plurality of first magnets arranged spaced apart and in parallel. The first permanent magnets are polarized in an up and down direction or left and right direction, and polarization directions of every two adjacent second permanent magnets are opposite to each other.

In some embodiments, the first magnet includes a permanent magnet and/or an electromagnet.

In some embodiments, the magnet array further includes a plurality of second magnets. The plurality of second magnets and the plurality of first magnets are arranged alternately and spaced apart. The second permanent magnets are polarized in a left and right direction or up and down direction, and polarization directions of every two adjacent second permanent magnets are opposite to each other.

The speaker in the present disclosure has the following beneficial effects. Since the driving circuit of the vibration system is planar, thickness of the speaker may be effectively reduced.

BRIEF DESCRIPTION OF THE DRAWINGS

The present disclosure will be further described below in conjunction with the drawings and embodiments.

DETAILED DESCRIPTION

Figure 1:
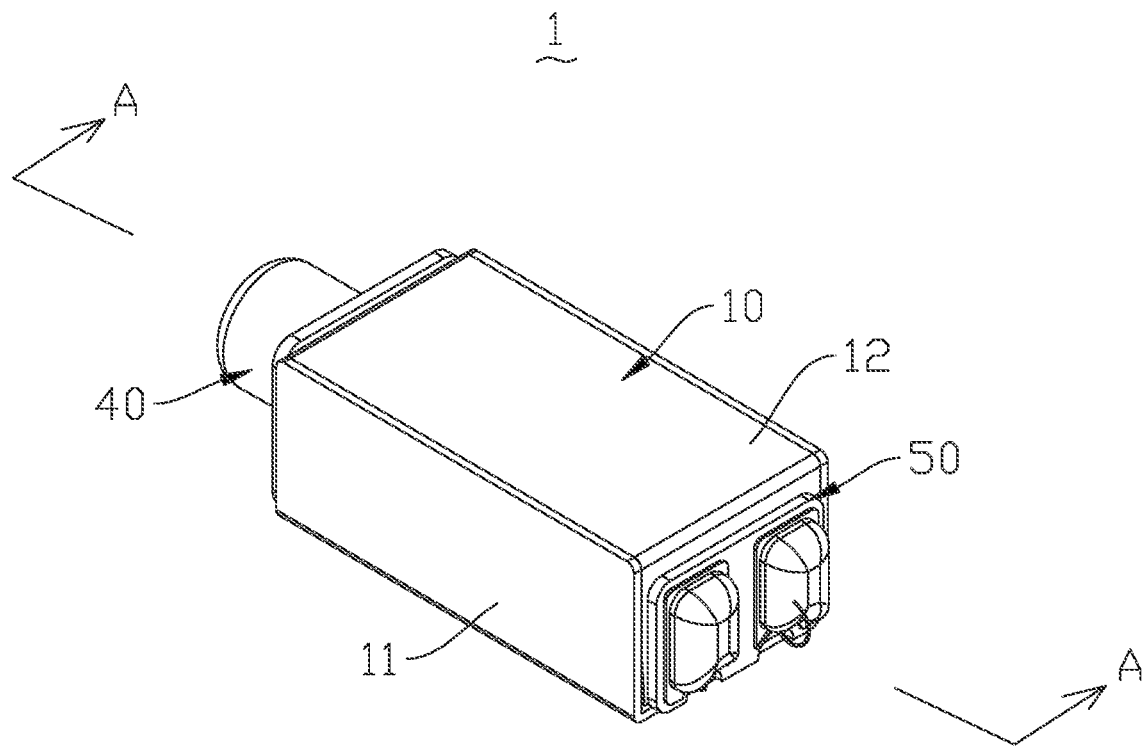
FIG. 1 is a three-dimensional structure illustration of a speaker in accordance with a first embodiment in the present disclosure.

In order to have a clearer understanding of the technical features, objectives and effects of the present disclosure, the specific embodiments of the present disclosure will be described in detail with reference to the accompanying drawings. In the following description, it should be understood that the orientation or positional relationship indicated "front", "rear", "up", "down", "left", "right", "vertical", "horizontal", "longitudinal", "lateral", "top", "bottom", "inner", "outer", "head", "tail", and so on, are based on the orientation or positional relationship shown in the drawings. The construction and operation in a specific orientation is only for the convenience of describing the technical solution, rather than indicating that the pointed device or element must have a specific orientation, and therefore cannot be understood as a limitation of the present disclosure.

Figure 2:
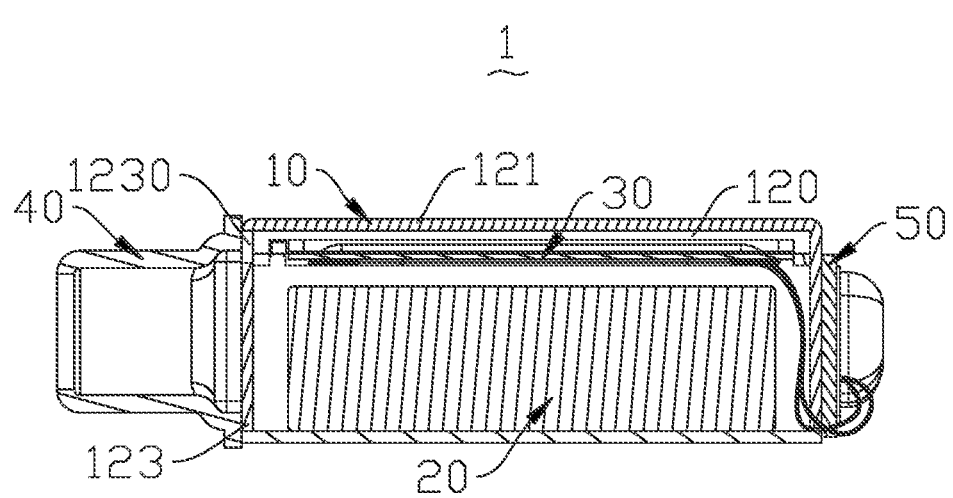
FIG. 2 is a cross section view of the speaker shown in FIG. 1 taken along line A-A.
Figure 3:
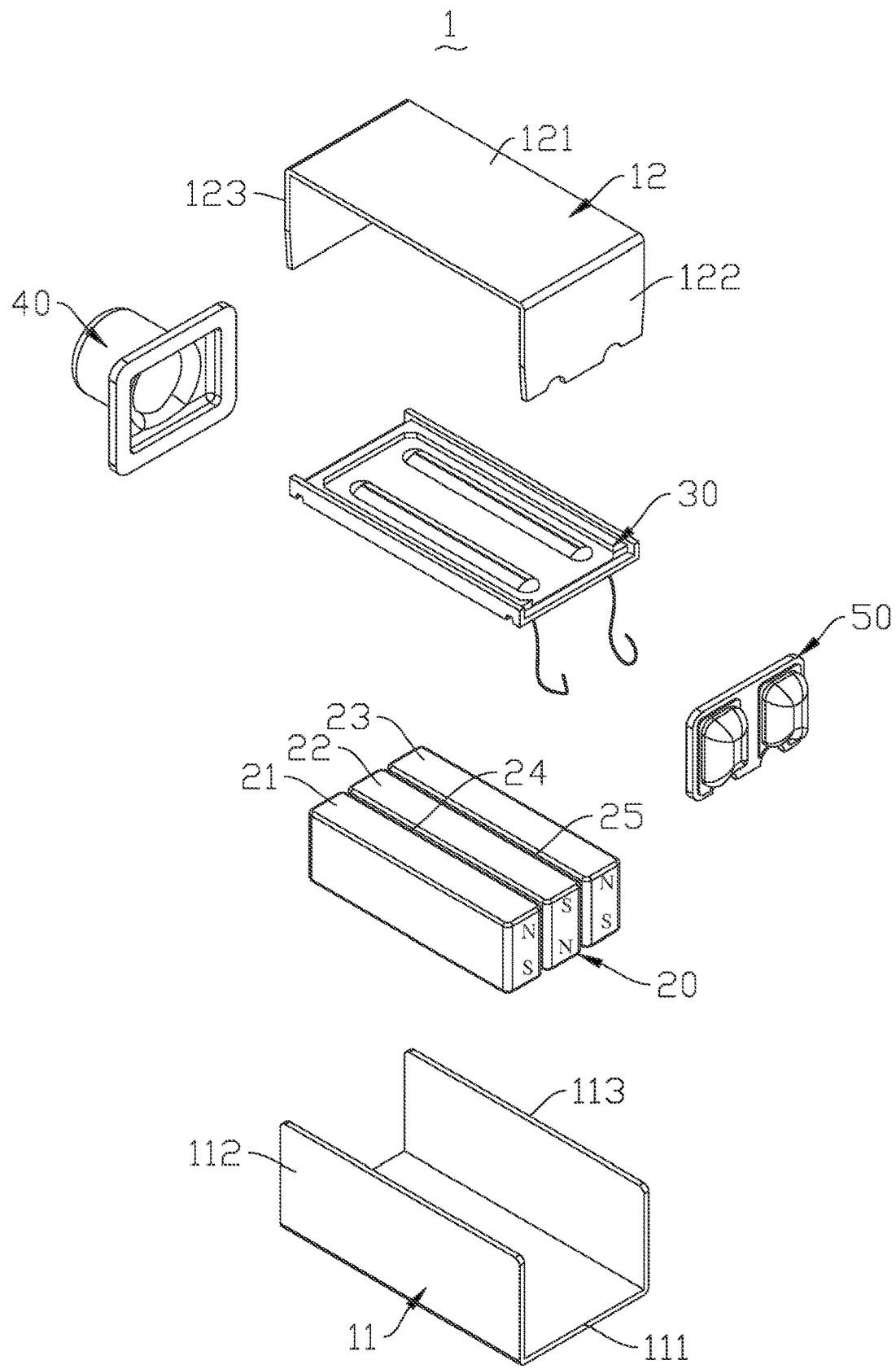
FIG. 3 is an exploded view of the speaker shown in FIG. 1.

FIGS. 1 to 3 illustrate a speaker 1 in accordance with a first embodiment of the present disclosure. The speaker 1 may be used in electronic products such as an earphone, a mobile phone, a hearing aids, and so on, to convert electrical signals into mechanical motion, and finally into sound signals. The speaker 1 may include a housing 10, a magnetic circuit system 20 arranged in the housing 10, and a vibration system 30 arranged in the housing 10 and movable under the action of the magnetic circuit system 20. In some embodiments, the magnetic circuit system 20 may be arranged on a bottom wall 111 of the housing 10, and the vibration system 30 is horizontally arranged directly above the magnetic circuit system 20. A sound cavity 120 is defined between the vibration system 30 and a top wall 121 of the housing 10. A sound outlet 1230 is defined at one end of the housing 10 corresponding to the sound cavity 120. The sound outlet 1230 connects the sound cavity 120 to outside of housing 10.

In some embodiments, the housing 10 may have a rectangular parallelepiped shape, and may include a lower housing 11 and an upper housing 12 matched with the lower housing 11. In some embodiments, the lower housing 11 may be in a U shape and may include a flat bottom wall 111 and two first side walls 112 and 113 respectively standing on opposite sides of the bottom wall 111. In some embodiments, the upper housing 12 may be in an inverted U shape and include a flat top wall 121 and two second side walls 122 and 123 respectively extending downward from two opposite sides of the top wall 121. The lower housing 11 and the upper housing 12 are cross mounted together to define an installation space for accommodating the magnetic circuit system 20 and the vibration system 30.

In some embodiments, the speaker 1 may further include a sound tube 40 arranged outside one end of the housing 10 and a circuit board 50 arranged outside the other end of the housing 10. The sound tube 40 connects with the sound hole 1230. The circuit board 50 is electrically coupled to the vibration system 30.

In some embodiments, the magnetic circuit system 20 may include a plurality of magnets arranged in an array fixed on the bottom wall 111 of the lower housing 11. Two magnetic poles of each magnet are located on upper and lower sides, and the polarities of adjacent magnets are opposite to each other. That is, when an N pole of one of the adjacent magnets is located up and an S pole of the adjacent magnets is located down, an N pole of the other magnet is located down, and an S pole of the other magnet is located up, vice versa. In some embodiments, a gap is defined between adjacent magnets to form a horizontal magnetic field directly above the gap. In some embodiments, the magnet may be a permanent magnet or an electromagnet. In some embodiments, all the magnets of the magnetic circuit system 20 may be permanent magnets, or all may be electromagnets, or some of them may be permanent magnets and some of them may be electromagnets.

As shown in FIG. 3, in some embodiments, the magnetic circuit system 20 may include a first magnet 21, a second magnet 22, and a third magnet 23 arranged on the bottom wall 111 of the lower housing 11 in parallel and spaced apart. In some embodiments, the first magnet 21, the second magnet 22, and the third magnet 23 may all be rectangular and strip shape. Polarities of the first magnet 21 and the third magnet 23 are the same, that is, an N pole is located on the top and an S pole is located on the bottom. AN N pole of the second magnet 22 is located on the bottom and an S pole of the second magnet 22 is located on the top. A longitudinal first gap 24 is defined between the first magnet 21 and the second magnet 22. A longitudinal second gap 25 is defined between the second magnet 22 and the third magnet 23.

Figure 4:
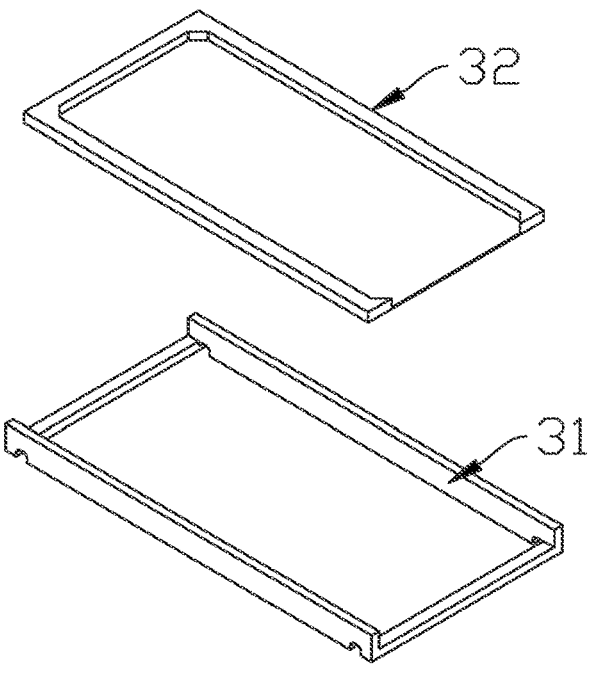
FIG. 4 is an exploded view of a vibration system of the speaker shown in FIG. 1.
Figure 4:
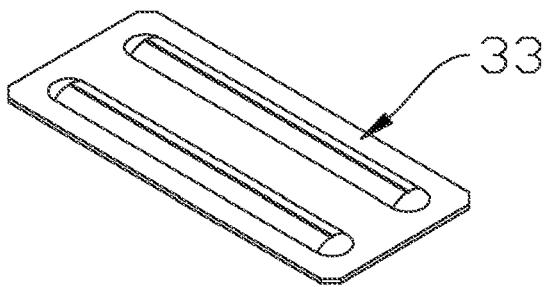
Figure 4:
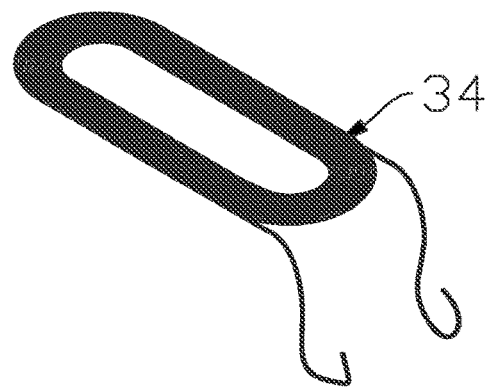
Figure 5:
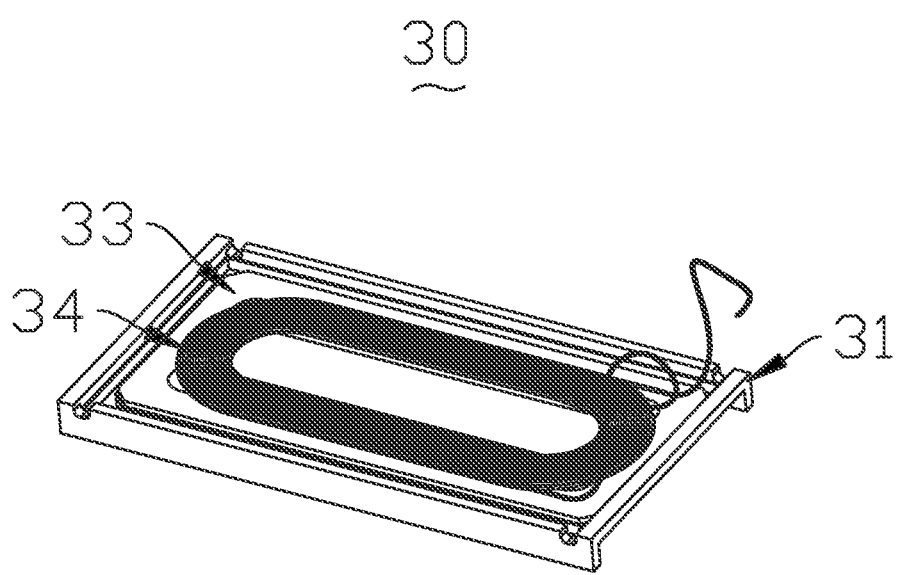
FIG. 5 is a three-dimensional structure illustration of the vibration system shown in FIG. 4, in a view of a bottom facing upward.
Figure 6:
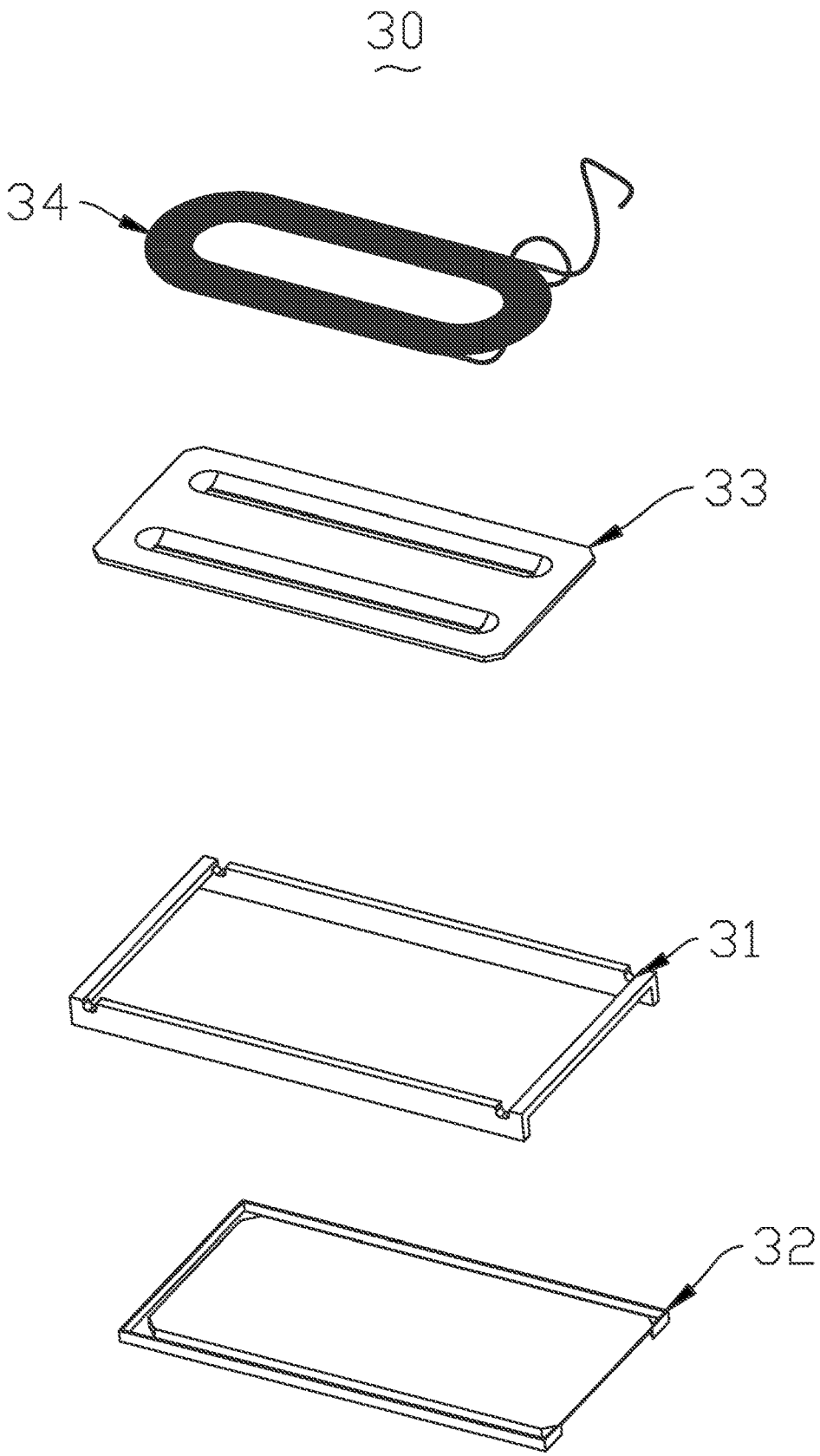
FIG. 6 is an exploded three-dimensional structure illustration of the vibration system shown in FIG. 5.

As shown in FIGS. 4 to 6, in some embodiments, the vibration system 30 includes a ring 31 fixed in the housing 10, a diaphragm 32 fixed on the ring 31, a paddle 33 mounted on a lower surface of the diaphragm 32, and a coil 34 mounted on the lower surface of the paddle 33. The coil 34 generates mechanical motion under the action of a magnetic field of the magnetic circuit system 20, and at the same time drives the diaphragm 32 coupled to the coil 34 to move together, whereby sound is generated. In some embodiments, the coil 34 may be mounted to the paddle 33 by bonding. The coil 34 constitutes a planar drive circuit of the vibration system 30. The diaphragm 32 and the paddle 33 together constitute the diaphragm of the vibration system 30.

In some embodiments, the ring 31 may have a rectangular ring shape matched with the housing 10. Peripheral edges of the diaphragm 32 are coupled to the ring 31. In some embodiments, the diaphragm 32 may be made of a Mylar film. In some embodiments, the paddle 33 may be made of a thin aluminum plate. A back surface of the paddle 33 may be adhered to a lower surface of the diaphragm 32. The paddle 33 may move up and down relative to the ring 31. The coil 34 may be bonded to a lower surface of the paddle 33 in a flat manner.

Figure 7:
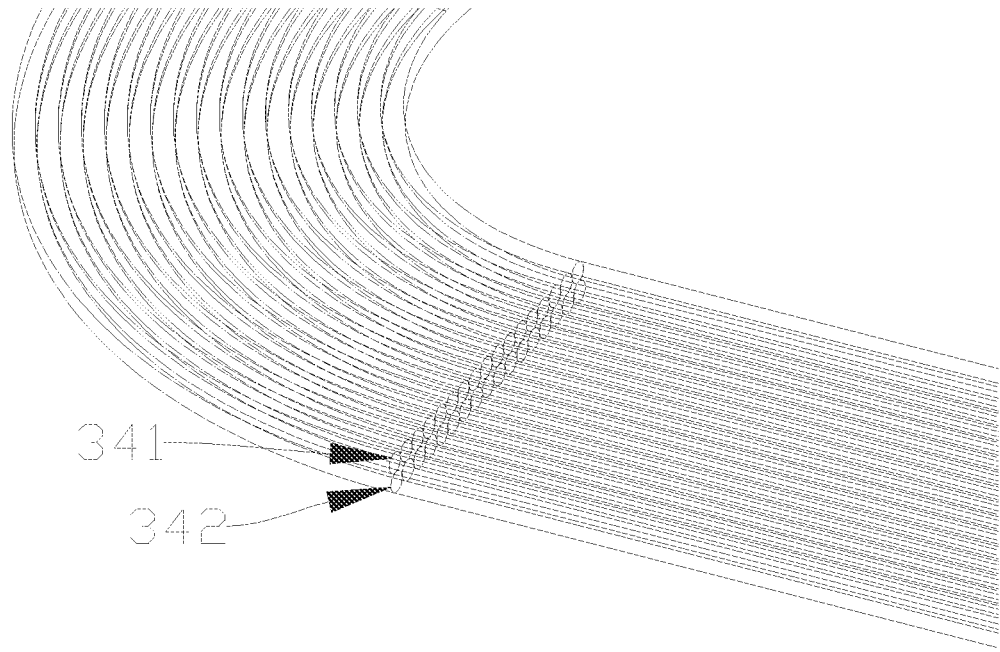
FIG. 7 is a partial structure illustration of a coil of the speaker shown in FIG. 1.

As shown in FIG. 7, in some embodiments, the coil 34 may include a planar first coil unit 341 and a planar second coil unit 342 coupled in series and stacked up and down. The first coil unit 341 and the second coil unit 342 may also be bonded to be integrated. The first coil unit 341 is formed by spirally winding a conductor wire from outside to inside in a plane. The second coil unit 342 is formed by spirally winding a conductor wire from inside to outside in a plane. The two spiral directions are same (that is, both are counterclockwise or clockwise). Here, current flow directions of the first coil unit 341 and the second coil unit 342 in the working process are same, so that forces received by the first coil unit 341 and the second coil unit 342 in the magnetic circuit system 20 is reversed and same. In some embodiments, a diameter of the conductor wire forming the coil 34 is about 0.02 mm.

It is understandable that, the coil 34 is not limited to a two-layer coil unit. According to requirements, one layer of coil unit or two or more layers of coil unit may also be applied. It is understandable that when the coil 34 includes multiple layers of coil unit, a winding type of a coil unit of each layer is an alternating arrangement of inner-outward spiral winding and outer-inward spiral winding. Spiral directions are the same, so that current directions in each layer of the coil unit is same. Specifically, a conductor wire is spirally wound in a plane from the outside to the inside to form a layer of coil units. When the conductor wire is wound to a target position of the inner circle, the conductor wire enters to a Next layer, and is spirally wound in a plane from inside to outside to form the next layer of coil units. When a layer is required to be added, then a Next layer is entered into and adopted a spiral winding from outside to inside. It is understandable that, the coil unit is not limited to spiral winding. Under the concept of the present disclosure, other suitable winding methods may also be used, or spiral winding and other winding methods may also be used together.

In some embodiments, the first coil unit 341 and the second coil unit 342 are both a shape of a racetrack. Both the first coil unit 341 and the second coil unit 342 include two parallel spaced straight portions and two arc-shaped portions. The two arc-shaped portions respectively couple the two straight portions together end-to-end in series.

In some embodiments, the two straight portions of the first coil unit 341 and the second coil unit 342 are located directly above the first gap 24 and the second gap 25 of the magnetic circuit system 20, so that the two straight portions are located in two horizontal magnetic fields, respectively. During an operation, according to the left-hand rule, after the coil 34 is energized, the two straight portions will be subjected to an upward or downward force in the horizontal magnetic field directly above the first gap 24 and the second gap 25 of the magnetic circuit system 20.

Specifically, the adjacent magnets of the magnetic circuit system 20 have opposite polarities, so that a horizontal magnetic field is formed under the straight portion of the coil unit. Current direction of the straight portion on both sides of the coil unit is opposite, and a direction of the magnetic field below is also opposite. Therefore, it may be ensured that force directions of the straight portion are consistent. When alternating current is applied, the coil 34 is forced to vibrate up and down, to drive the paddle 33 and the diaphragm 32 to vibrate, then to vibrate air to generate sound. It is understandable that, the first coil unit 341 and the second coil unit 342 are not limited to the shape type of a racetrack. In some embodiments, it may also take other suitable shapes.

It is understandable that, the structure of the speaker 1 in this embodiment of the present disclosure is simple. It may be mainly composed of the housing 10, the magnetic circuit system 20 composed of a magnet array, and the vibration system 30. Processing technology is simple, and cost may be reduced by more than 50% compared with speakers in the related technology. Further, thickness of the speaker 1 may also be set smaller. Compared with equivalent speakers in the related technology, the thickness may be reduced by more than 40%, and it is more suitable for current trend of thinning.

Figure 8:
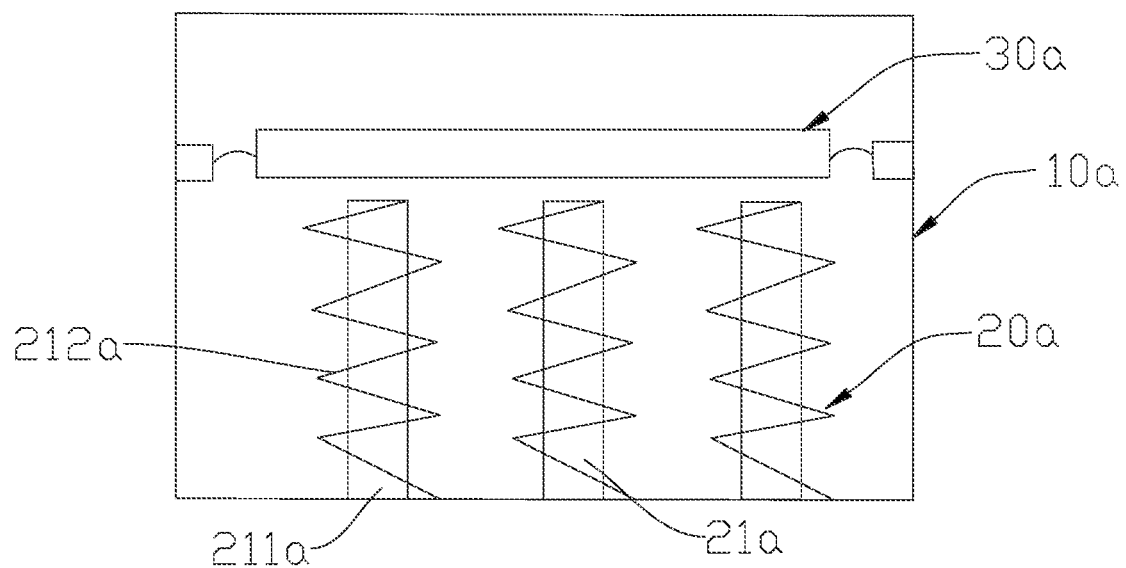
FIG. 8 is a structure illustration of a speaker in accordance with a second embodiment of the present disclosure.

FIG. 8 is a structure illustration of a speaker in accordance with a second embodiment of the present disclosure. The speaker includes a housing 10a, a magnetic circuit system 20a and a vibration system 30c. The vibration system 30a is similar to the vibration system 30 in the above-mentioned embodiment, therefore no additional description is given herein. As shown in FIG. 8, the magnetic circuit system 20a includes several electromagnets 21a arranged spaced in apart and in parallel. Each electromagnet 21a may include an iron core 211a and a coil 212a wound around a side of the iron core 211a. The electromagnet 21 generates a corresponding magnetic field after being energized to drive the vibration system 30a to work. The electromagnet 21a may better control magnetic field intensity of the magnetic circuit system 20, so that the speaker may adapt to different application scenarios.

Figure 9:
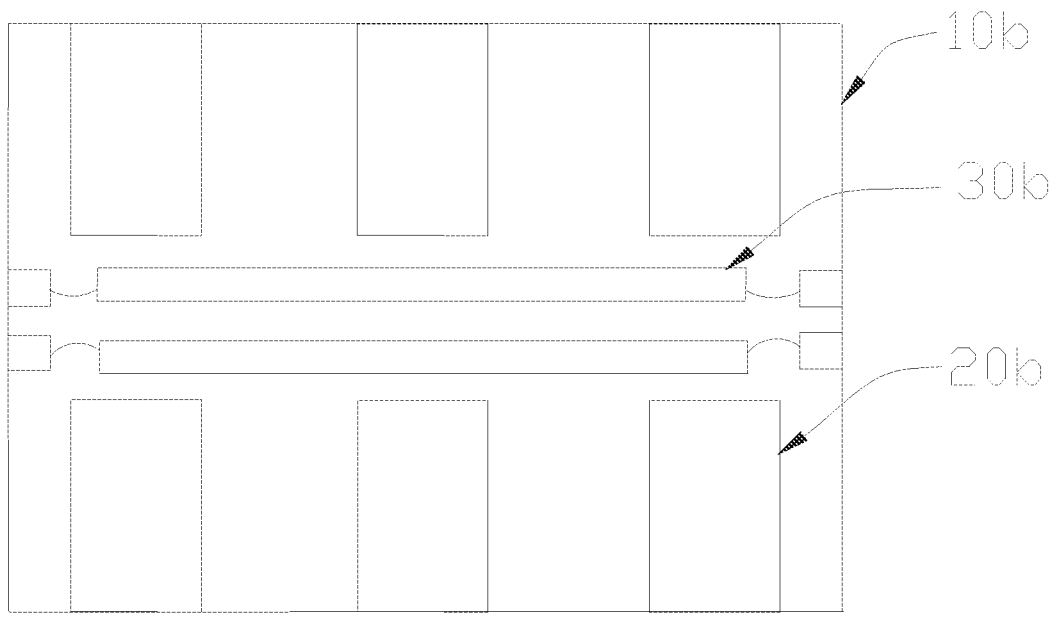
FIG. 9 is a structure illustration of a speaker in accordance with a third embodiment of the present disclosure.

FIG. 9 is a structure illustration of a speaker in accordance with a third embodiment of the present disclosure. The speaker is a composite speaker and includes two magnetic circuit systems 20b and two vibration systems 30b. The magnetic circuit system 20b and the vibration system 30b are respectively similar to the magnetic circuit system 20 and the vibration system 30 in the above-mentioned embodiment, therefore no additional description is given herein. As shown in FIG. 9, the two magnetic circuit systems 20b in this embodiment are respectively arranged on a top wall and a bottom wall of the housing 10b. The two vibration systems 30b are arranged between the two magnetic circuit systems 20b in one-to-one correspondence arrangement.

Figure 10:
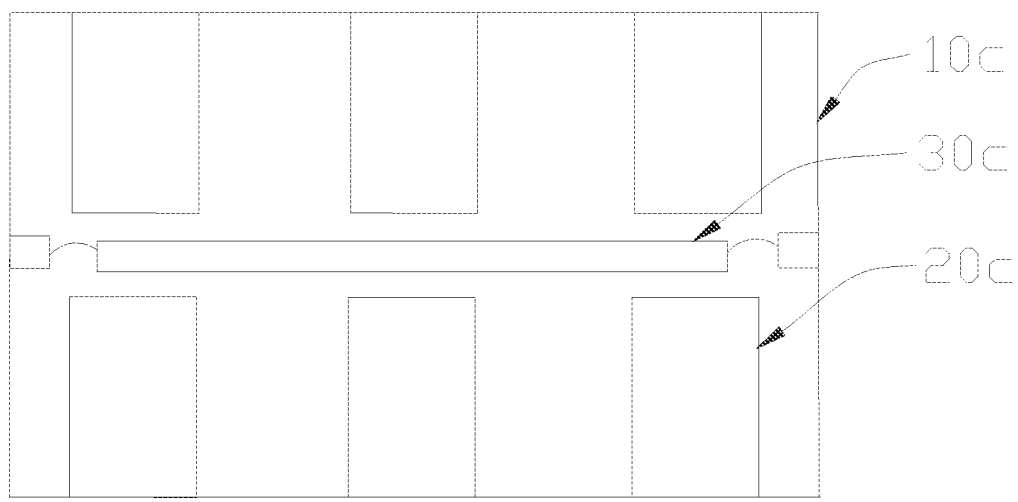
FIG. 10 is a structure illustration of a speaker in accordance with a fourth embodiment of the present disclosure.

FIG. 10 is a structure illustration of a speaker in accordance with a fourth embodiment of the present disclosure. The speaker is also a composite speaker and includes two magnetic circuit systems 20c and one vibration system 30c. The magnetic circuit system 20c and the vibration system 30c are also similar to the magnetic circuit system 20 and the vibration system 30 in the above-mentioned embodiment, therefore no additional description is given herein. As shown in FIG. 10, the two magnetic circuit systems 20c are respectively arranged on a top wall and a bottom wall of the housing 10c, and the vibration system 30c is arranged between the two magnetic circuit systems 20c.

Figure 11:
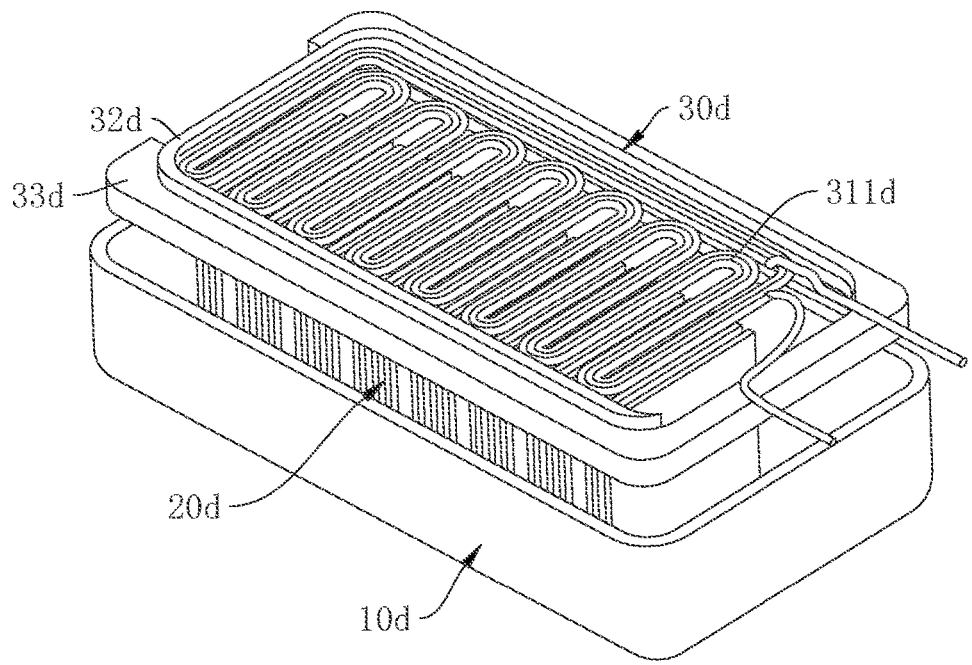
FIG. 11 is a partial three-dimensional structure illustration of a speaker in accordance with a fifth embodiment of the present disclosure.
Figure 12:
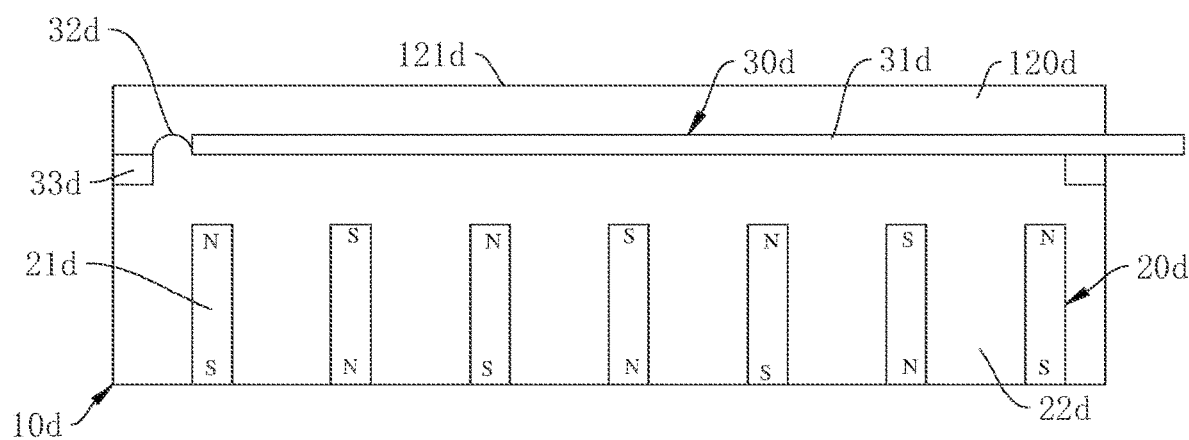
FIG. 12 is a structure illustration of the speaker shown in FIG. 11 in a longitudinal sectional view.
Figure 13:
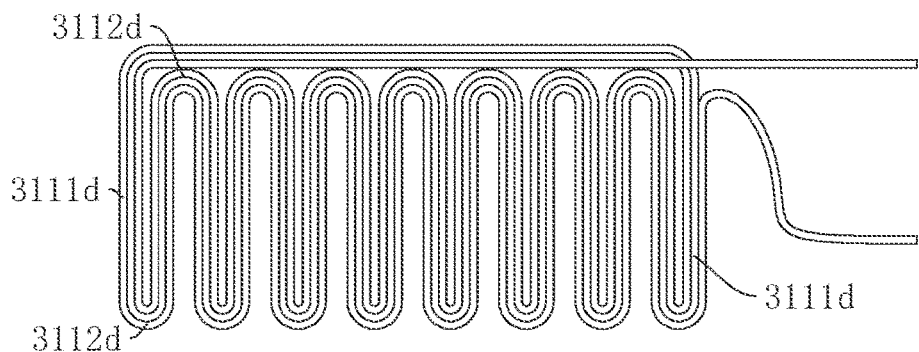
FIG. 13 is a structure illustration of a driving circuit of the speaker shown in FIG. 11.

As shown in FIGS. 11 to 13, the speaker 1d in accordance with a fifth embodiment of the present disclosure may include a housing 10d, a magnetic circuit system 20d arranged in the housing 10d, and a vibration system 30d arranged in the housing 10d and may be moved by the magnetic circuit system 20d. A sound cavity 120d is defined between the vibration system 30d and a top wall 121d of the housing 10d.

In some embodiments, the magnetic circuit system 20d may include a permanent magnet array. The permanent magnet array includes a plurality of first permanent magnets 21d arranged spaced apart and in parallel. A driving space 22d is defined between every two adjacent first permanent magnets 21d. Every two adjacent first permanent magnets 21d are arranged alternately in polarity. The first permanent magnet 21d may be a sheet-shaped permanent magnet. The sheet-shaped permanent magnet is vertically and fixedly arranged at a bottom of the housing 10d. In other embodiments, the first permanent magnet 21d may also be a bar-shaped permanent magnet. In some embodiments, polarities of every two adjacent first permanent magnets 21d are an N to form an N-S-N polar structure. For example, upper ends of first, third, fifth, and seventh permanent magnets 21d are N poles and lower ends are S poles. Upper ends of second, fourth, and sixth first permanent magnets 21d are S poles and lower ends are N poles. In some embodiments, polarities of adjacent sides of every two adjacent first permanent magnets 21d may be alternately to form an N-S-S-N polar structure in a horizontal direction. For example, left sides of first, third, fifth, and seventh first permanent magnets 21d are N poles and right sides are S poles. Left sides of second, fourth, and sixth first permanent magnets 21d are S poles and right sides are N poles.

The vibration system 30d includes a flexible circuit board 31d provided with a driving circuit 311d. The driving circuit 311d includes a plurality of straight portions 3111d. The straight portions 3111d are correspondingly arranged directly above the driving space 22d between every two adjacent first permanent magnets 21d. The driving circuit 311d may be one, two, three or even multiple lines arranged side by side. Two or more drive lines 311d are coupled in series and may also be coupled in parallel. In some embodiments, the straight section 3111d is arranged perpendicular to the arrangement direction of the permanent magnet array to reduce power consumption and improve efficiency. The driving circuit 311d is printed on the flexible circuit board 31d to form a planar driving circuit. The driving circuit 311d may be single-layer, double-layer, or multi-layer printing. Further, the vibration system 30d may also include a Mylar film 32d and a ring 33d. The Mylar film 32d connects the ring 33d with the flexible circuit board 31d. The vibration system 30d is fixedly installed in the housing 10d through the ring 33d. The ring 33d may be an annular gasket. It may be placed on a protruding of the lower housing to support the flexible circuit board 31d. The Mylar film 32d and the flexible circuit board 31d together constitute the diaphragm of the vibration system 30d.

As shown in FIG. 11 and FIG. 13, the straight portions 3111d of the driving line 311d are coupled in series. The flexible circuit board 31d is also provided with curved connecting sections 3112d for series connection between the straight portions 3111d of the driving line 311d. In some embodiments, the connecting sections 3112d and the straight portions 311d together form a substantially S-shaped drive line 311d.

Current directions of the corresponding driving lines 311d directly above every two adjacent driving spaces 22d are opposite. According to the left-hand rule, the energized circuit will be subjected to an upward or downward force in the magnetic field. According to the arrangement of the permanent magnet array, directions of the magnetic fields generated in every two adjacent driving spaces 23d are opposite. Therefore, it may be ensured that all the driving lines 311d have same force directions (upward or downward at the same time). When changed current is applied to the driving circuit 311d, the flexible circuit board 31d will be forced to vibrate up and down, to vibrate air and generate sound.

Figure 14:
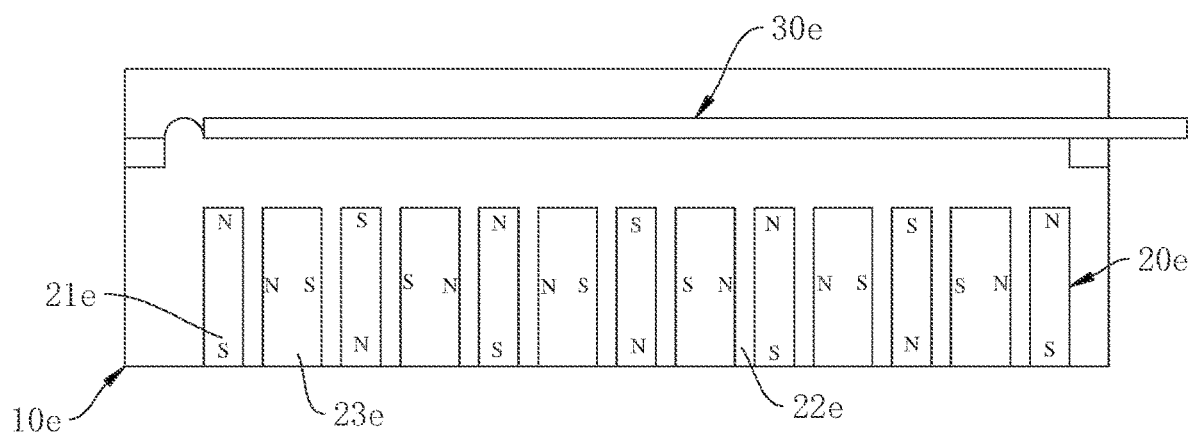
FIG. 14 is a structure illustration of a speaker in accordance with a sixth embodiment of the present disclosure, in a longitudinal sectional view.

As shown in FIG. 14, the speaker 1e in accordance with a six embodiment of the present disclosure may include a housing 10e, a magnetic circuit system 20e arranged in the housing 10e, and a vibration system 30e arranged in the housing 10e and movable by the magnetic circuit system 20d. A sound cavity 120e is defined between the vibration system 30e and a top wall 121e of the housing 10e. The sound cavity 120e may extend to outside through a sound hole (not shown).

In some embodiments, the magnetic circuit system 20e may include a permanent magnet array, and the permanent magnet array may include a plurality of first permanent magnets 21e arranged spaced apart and in parallel. A second permanent magnet 23e is arranged spaced apart between every two adjacent first permanent magnets 21e. That is, the first permanent magnets 21e and the second permanent magnets 23e are alternately arranged spaced apart. The first permanent magnets 21e are polarized in the up and down direction and polarization directions of every two adjacent first permanent magnets 21e are opposite to each other. The second permanent magnets 23e are polarized in the left and right direction and polarization directions of every two adjacent second permanent magnets 23e are opposite to each other. For example, as shown in the figure, upper ends of first, third, fifth, and seventh permanent magnets 21e are N poles and lower ends are S poles. Upper ends of second, fourth, and sixth first permanent magnets 21e are S poles and lower ends are N poles. Left side of the first, third, and fifth second permanent magnets 23e are N poles, and the right side is S poles. Left side of second, fourth, and sixth second permanent magnets 23e are S poles and right sides are N poles. The first permanent magnet 21e and the second permanent magnet 23e may be sheet-shaped permanent magnets. The sheet-shaped permanent magnets are vertically fixed at a bottom of the housing 10e. In other embodiments, the first permanent magnets 21e and the second permanent magnets 23e may also be strip-shaped permanent magnets.

Figure 15:
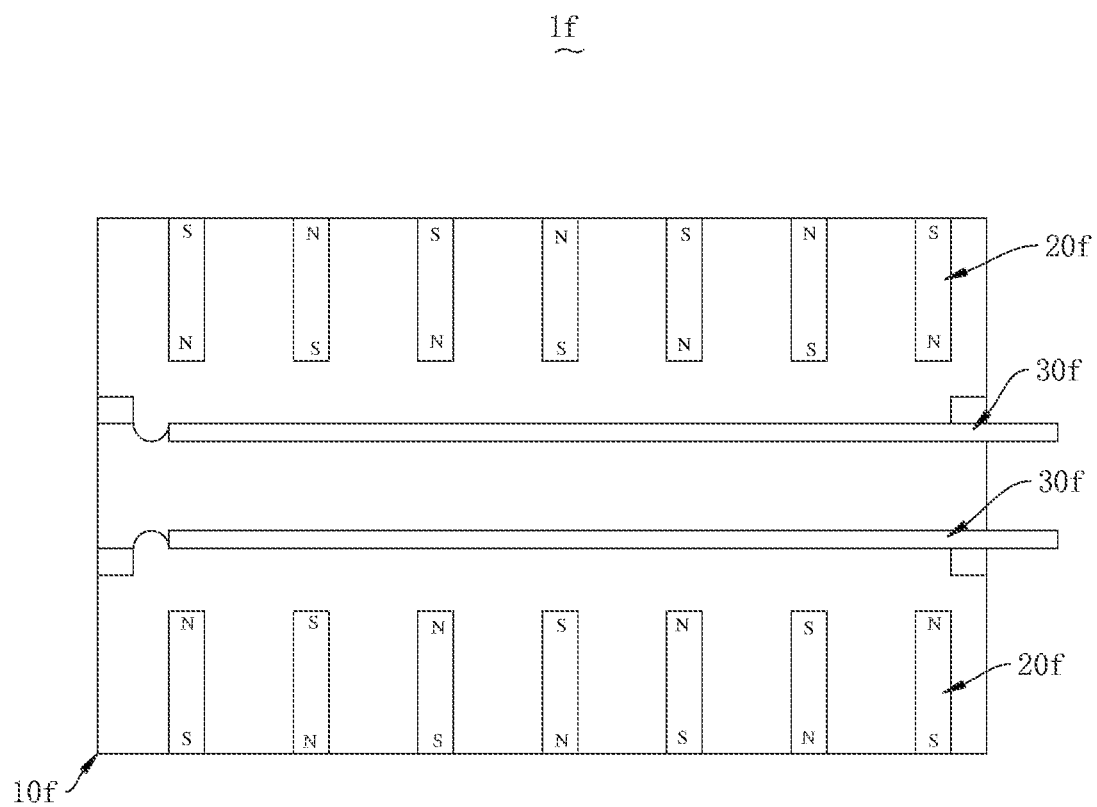
FIG. 15 is a structure illustration of a speaker in accordance with a seventh embodiment of the present disclosure, in a longitudinal sectional view.

FIG. 15 illustrates a speaker if in accordance with a seventh embodiment of the present disclosure. The speaker if may include a housing 10f, two magnetic circuit systems 20f arranged in the housing 10f, and two vibration systems 30f arranged in the housing 10f and movable under the action of the two magnetic circuit systems 20f. The two vibration systems 30f are arranged up and down in parallel and spaced apart. The two magnetic circuit systems 20f are respectively arranged on upper and lower sides of the two vibration systems 30f and are arranged in a mirror image of each other. The specific structures of the magnetic circuit system 20f and the vibration system 30f may respectively adopt the same structure of the magnetic circuit system 20 and the vibration system 30, therefore no additional description is given herein.

It is understandable that the above-mentioned technical features may be used in any combination without limitation.

The above descriptions are only the embodiments of the present disclosure, which do not limit the scope of the present disclosure. Any equivalent structure or equivalent process transformation made by using the content of the description and drawings of the present disclosure, or directly or indirectly applied to other related technologies in the same way, all fields are included in the scope of patent protection of the present disclosure.

What is claimed is:

1. A speaker, comprising a housing and at least one magnetic circuit system and at least one vibration system arranged in the housing; wherein the at least one vibration system comprises at least one layer of driving circuit configured to generate mechanical motion under the action of magnetic field of the at least one magnetic circuit system, and a diaphragm driven by the at least one layer of driving circuit; wherein the at least one layer of driving circuit is mounted to the diaphragm and is planar shaped; the at least one layer of driving circuit comprises at least one layer of coil unit; the at least one vibration system comprises a ring; the diaphragm comprises a film and a paddle; the ring is horizontally arranged directly above the magnetic circuit system; a peripheral edge of the film is coupled to the ring; the paddle is moveable up and down relative to the ring.

2. The speaker as claimed in claim 1, wherein the at least one layer of coil unit is formed by winding conductor wires and is planar-shaped.

3. The speaker as claimed in claim 2, wherein the at least one magnetic circuit system comprises a plurality of magnets arranged in an array directly below the at least one layer of coil unit; and two magnetic poles of each of the magnets are located on an upper side and a lower side thereof, and polarization directions of adjacent magnets are opposite to each other.

4. The speaker as claimed in claim 3, wherein the plurality of magnets comprises three magnets arranged spaced apart; a first gap is defined between a first magnet and a second magnet of the three magnets; a second gap is defined between the second magnet and a third magnet of the three magnets; the at least one layer of coil unit comprises two straight portions with opposite current directions during an operation; and the two straight portions are respectively arranged corresponding to the first gap and the second gap.

5. The speaker as claimed in claim 4, wherein the at least one layer of coil unit is formed by spirally winding conductor wires in a plane.

6. The speaker as claimed in claim 5, wherein the at least one layer of coil unit is in a shape of a racetrack; and the three magnets are all in a shape of a strip and are arranged in parallel and spaced apart.

7. The speaker as claimed in claim 3, wherein at least parts of the plurality of magnets comprises permanent magnets and/or electromagnets.

8. The speaker as claimed in claim 2, wherein the at least one layer of coil unit comprises at least two layers of coil unit; the at least two layers of coil unit are coupled in series and stacked; and current directions of the at least two layers of coil unit are the same during an operation.

9. The speaker as claimed in claim 8, wherein a back surface of the paddle is coupled to a front surface of a middle part of the film; and a back surface of the at least one layer of coil unit is coupled to a front surface of the paddle.

10. The speaker as claimed in claim 2, wherein the at least one magnetic circuit system comprises two magnetic circuit systems; the two magnetic circuit systems are arranged up and down; and the at least one vibration system is arranged between the two magnetic circuit systems.

11. The speaker as claimed in claim 10, wherein the at least one vibration system comprises two vibration system; the two vibration systems are arranged up and down and spaced apart, and respectively correspond to the two magnetic circuit systems.

12. The speaker as claimed in claim 1, wherein the diaphragm comprises a circuit board; and the at least one layer of driving circuit is printed on the circuit board.

13. The speaker as claimed in claim 12, wherein the circuit board comprises a flexible circuit board.

14. The speaker as claimed in claim 1, wherein the magnetic circuit system comprises a plurality of first magnets arranged in parallel and spaced apart; the first permanent magnets are polarized in a up and down direction or left and right direction, and polarization directions of every two adjacent first permanent magnets are opposite to each other.

15. The speaker as claimed in claim 14, wherein the at least one layer of driving circuit comprises a plurality of straight portions; and the straight portions are correspondingly arranged directly above driving space between each of two adjacent first magnets.

16. The speaker as claimed in claim 14, wherein the magnetic circuit system comprises a plurality of second magnets arranged alternately with the plurality of first magnets; the first permanent magnets are polarized in a up and down direction and polarization directions of every two adjacent first permanent magnets are opposite to each other, the second permanent magnets are polarized in a left and right direction and polarization directions of every two adjacent second permanent magnets are opposite to each other.

17. The speaker as claimed in claim 1, wherein the diaphragm is planar-shaped, the housing is shaped approximately like a cuboid, and a sound hole is defined on one end of the housing; wherein the speaker comprises a sound tube arranged outside the one end of the housing and a circuit board arranged outside the other end of the housing, the sound tube is fluidly connected to the sound hole, and the circuit board is electrically connected to the vibration system.

* * * * *